United States Patent
Stinnett et al.

(10) Patent No.: US 6,355,557 B2
(45) Date of Patent: *Mar. 12, 2002

(54) OXIDE PLASMA ETCHING PROCESS WITH A CONTROLLED WINEGLASS SHAPE

(75) Inventors: James A. Stinnett, Mountain View; Cynthia B. Brooks, Sunnyvale; Walter R. Merry, Cupertino, all of CA (US); Jason Regis, Amesbury, MA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/121,190

(22) Filed: Jul. 22, 1998

(51) Int. Cl.[7] ................... H01L 21/4763; H01L 21/311; H01L 21/302
(52) U.S. Cl. .................... 438/640; 438/689; 438/700; 438/712; 438/711; 438/713
(58) Field of Search ............................. 438/623, 689, 438/691, 692, 709, 711, 718, 723, 640, 700, 706, 712, 713

(56) References Cited

U.S. PATENT DOCUMENTS

| | | | | |
|---|---|---|---|---|
| 4,495,220 A | * | 1/1985 | Wolf et al. ................. 438/623 |
| 4,865,685 A | * | 9/1989 | Palmour ..................... 438/718 |
| 5,021,920 A | * | 6/1991 | Smith ......................... 361/311 |
| 5,180,689 A | * | 1/1993 | Liu et al. .................... 438/640 |
| 5,399,237 A | * | 3/1995 | Keswick et al. ............. 216/68 |
| 5,746,884 A | * | 5/1998 | Gupta et al. ............. 156/643.1 |
| 5,779,807 A | * | 7/1998 | Dornfest et al. ............. 134/1.2 |
| 5,882,424 A | * | 3/1999 | Taylor et al. ................ 134/1.1 |
| 5,965,035 A | * | 10/1999 | Hung et al. .................... 216/72 |
| 6,015,761 A | * | 1/2000 | Merry et al. ................ 438/727 |
| 6,068,784 A | * | 5/2000 | Collins et al. ................ 216/68 |

* cited by examiner

Primary Examiner—Charles Bowers
Assistant Examiner—Brook Kebede
(74) Attorney, Agent, or Firm—Charles S. Guenzer

(57) ABSTRACT

An oxide etching method, particularly applicable to forming through an oxide layer a wineglass shaped contact or via hole of controlled shape. The wineglass hole is particularly useful for eased metal hole filling. The bowl is etched by first etching an anisotropic hole through a mask aperture, and then isotropically etching through the same mask aperture. The relative periods of the anisotropic and isotropic etch determine the lateral-to-vertical dimensions of the bowl. The stem is then etched through the same mask aperture with a strongly anisotropic etch. The isotropic etch may be performed in the same chamber as the anisotropic etch or may advantageously be performed in a separate etch chamber having a remote plasma source.

23 Claims, 4 Drawing Sheets

OXIDE PLASMA ETCHING PROCESS WITH A CONTROLLED WINEGLASS SHAPE

FIELD OF THE INVENTION

The invention relates generally to a plasma etching process. In particular, it relates to a process for etching into silicon oxide an aperture having a complex shape.

BACKGROUND ART

The continuing development of silicon-based integrated circuits has integrated an ever increasing number of semiconductor devices on a single chip. The number is approaching tens of millions, and is still growing. This level of integration has been accomplished in part by ever more complex structures and processes.

One such structure is the inter-level via or contact. To electrically interconnect the tens of millions of devices requires a multi-layer wiring structure. In somewhat regularly arranged memories, two or more wiring layers are needed, while in the more irregularly arranged logic devices five or more wiring layers are currently needed. As illustrated in the cross-sectional view of FIG. 1, each wiring level includes an inter-level insulating layer 10 interposed between a lower layer 12 and a metallic upper layer. Typically, the insulating layer 10 is formed of silicon dioxide or related silica glasses, both hereinafter referred to as an oxide. The lower layer 12 may be the silicon substrate in which is already formed various types of semiconductor devices that need to be contacted. Alternatively, the lower layer 12 may be a lower wiring layer which is already formed into a lower interconnect pattern. The upper metal layer 14 is eventually formed into its own interconnect wiring pattern. The interconnect metal is usually aluminum or an aluminum alloy although its composition is not directly related to the present invention.

Usually, the deposition of the upper metal layer 14 includes deposition of the same metal into an aperture 16 preformed in the oxide layer 10. This invention is directed to the etching of that aperture 16. If the underlying layer is silicon or polysilicon, the aperture 16 is referred to as a contact hole, and extra care must be exercised to not degrade the semiconducting characteristics of the underlying layer 12. If the underlying layer is a metal or polysilicon interconnect, the aperture 16 is referred to as a via hole. As the level of integration has increased, the via or contact holes 16 have been required to become narrower and more vertically anisotropic, that is, to have a high aspect ratio of depth to width. Methods for forming highly anisotropic contact and via holes 16 in an oxide have been developed for use in a plasma reactor. A typical method uses a fluorocarbon or hydrofluorocarbon etching gas in an argon carrier gas and applies an RF bias to the pedestal supporting the wafer. The RF bias creates a DC electrical self-bias in the plasma adjacent to the wafer, and the DC field accelerates the etching ions or an inactive carrier gas ions towards the wafer in a vertical flux pattern. The resulting etching, if properly controlled, is highly anisotropic with oxide holes 16 having aspect ratios of five or even more being attainable.

However, this anisotropic inter-level etch has at least two problems. First, very highly anisotropic etching often requires the use of high-density plasma reactors, often using inductive coupling of RF energy into plasma source region of the etch reactor as well as the capacitive coupling of RF energy onto the pedestal to create the DC self-bias. The recently developed high-density plasma reactors are expensive. Secondly, the filling of the metal layer 14 into a narrow and deep hole 16 becomes problematic. Sputter deposition of the metal tends to bridge the top of a rectangular hole 16 before it is filled, thus creating a void in the contact or via. Methods are available to fill such a narrow and deep hole, but again these methods are complex and often require expensive metal deposition equipment.

In some structures, the contact or via needs to be narrow at its bottom but the spacing is more relaxed at its top. Typically, the resolution required of wiring patterns decreases in the upper wiring layers. To take advantage of these differing requirements, a wine-glass etch pattern, as illustrated in FIG. 1, has been developed. The hole includes a highly anisotropic lower portion 18 (referred to as the stem) and a wider upper portion 20 (referred to as the bowl).

One way of forming the wine glass, as partially illustrated in the cross-sectional view of FIG. 2, is to cover the oxide layer 10 with a patterned mask layer 22 having an mask aperture 24 generally conforming to the area of the stem 18 and the desired area of the contact to the substrate 12. A first etching step uses an isotropic etch which not only etches downwardly in the area beneath the mask aperture 24 but also etches sidewardly to undercut the mask layer. The generally isotropic etch can be performed in a plasma reactor without significant RF biasing of the pedestal or with a remote plasma source (RPS). As the figure shows, the isotropic etch with RPS actually etches somewhat more laterally than vertically. Typically, the lateral-to-vertical ratio (L/V) depends on the density and dopant level of the material being etched. Less dense, highly doped materials etch with L/V ratios near or below 1.0 while dense, undoped films etch with L/V ratios ranging from 1.3 to 2.0. After the desired depth of the bowl 20 has been etched in the oxide 10, the structure is anisotropically etched through the oxide layer 10 to the underlying layer 12, as described above, to form the stem 18 underlying the mask aperture. The metal layer 14 is then sputtered to fill the wineglass-shaped hole 16.

The aspect ratio of the stem portion 18 of the hole 16 is significantly less than a substantially vertical hole 16 extending all the way from the surface of the oxide 10, thus not requiring complex and expensive etch equipment or alternatively an etching chemistry requiring precise control in a commercial environment. Also, metal filling of the wineglass hole 16 is also more easily accomplished, thus simplifying that step as well.

Nonetheless, standard wine-glass oxide etching has its problems. For a given size of mask aperture 24, there is only a limited range with the described isotropic etch to control the ratio of the vertical and horizontal dimensions of the bowl 20. The L/V ratio can be controlled with the RPS chamber by varying control parameters such as cathode temperature, the ratio of $O_2/CF_4$ (or other fluorine containing gas), and pressure. However, a typically attainable L/V range is limited to about ±20% with these control parameters. Furthermore, the parameters needed to reduce the L/V ratio substantially reduce the etch rate. Generally, in the conventional processes, the lateral dimension of the bowl 20 tends to be too large, particularly as the spacing between contacts continues to decrease. Nonetheless, the depth of the bowl 20 should be maintained relatively large so as to promote metal filling of the narrow stem 18. Thus, it is desired to reduce the ratio of lateral to vertical etching in the bowl etch. Furthermore, to optimize an integrated process of etching and filling, it is desired to be able to control the lateral-to-vertical ratio as well as to more finely control the shape of the bowl. Such control is not directly available in the processes of the prior art.

SUMMARY OF THE INVENTION

The invention may be summarized as a three-step wineglass etch process with a common mask. In the first step, an anisotropic etch is performed to a depth determining the vertical dimension of the bowl of the wine glass. In the second step, an isotropic etch is performed to achieve the desired lateral extent. The isotropic etch will further increase the depth of the bowl. In the third step, another anisotropic etch is performed to etch the stem of the wineglass down to the underlying layer.

DETAILED DESCRIPTION OF THE PREFERRED EMBODIMENTS

The invention allows the independent control of the lateral and vertical dimensions of the etching of the bowl in a wineglass etch. The process, summarized in the flow chart of FIG. 3, creates the structure sequentially developed in the cross-sectional views of FIGS. 4 through 7.

Figure 1:
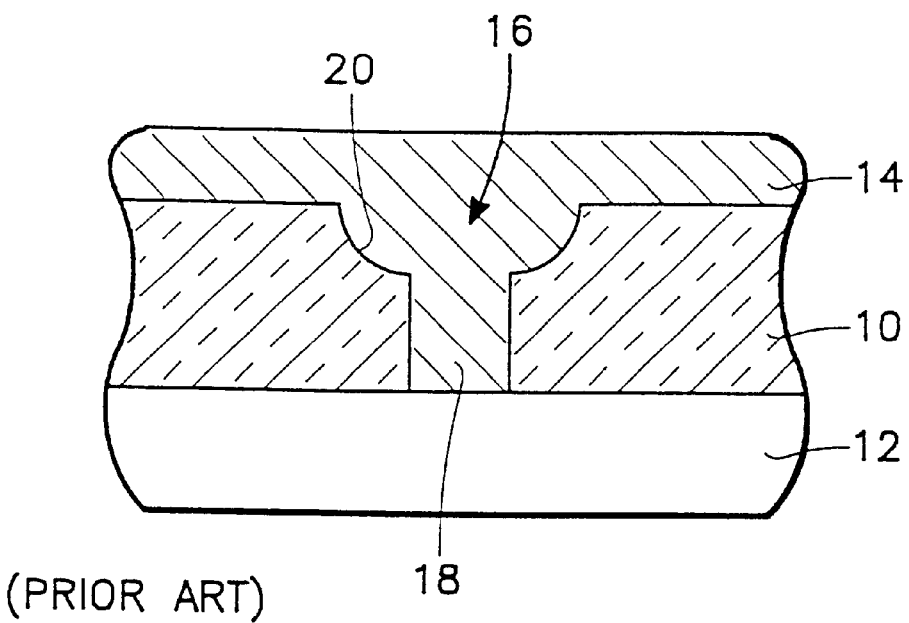
FIG. 1 is a cross-sectional view of a wineglass contact or via hole through an oxide layer after the metal filling step.
Figure 2:
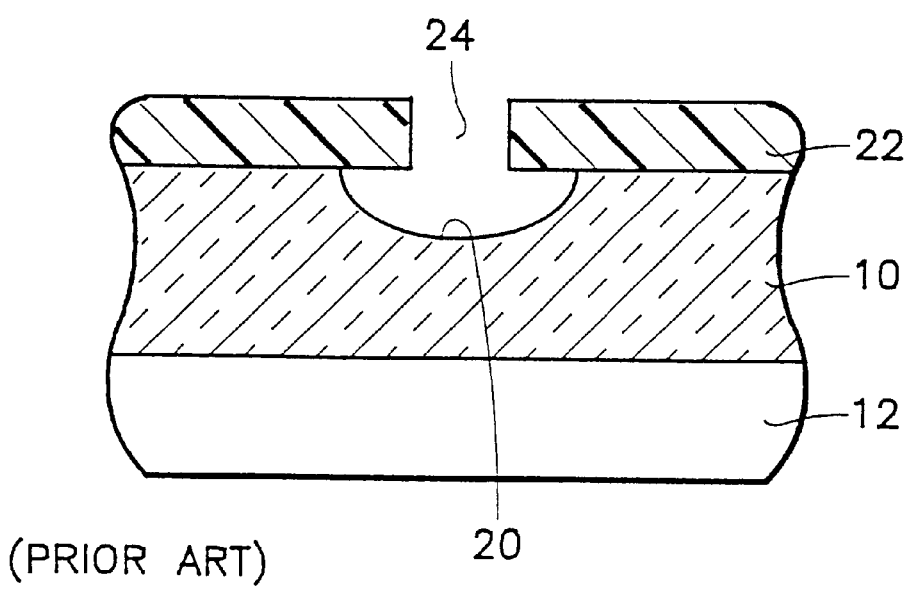
FIG. 2 is a cross-sectional view of the process conventionally used in etching the bowl of the wineglass.
Figure 3:
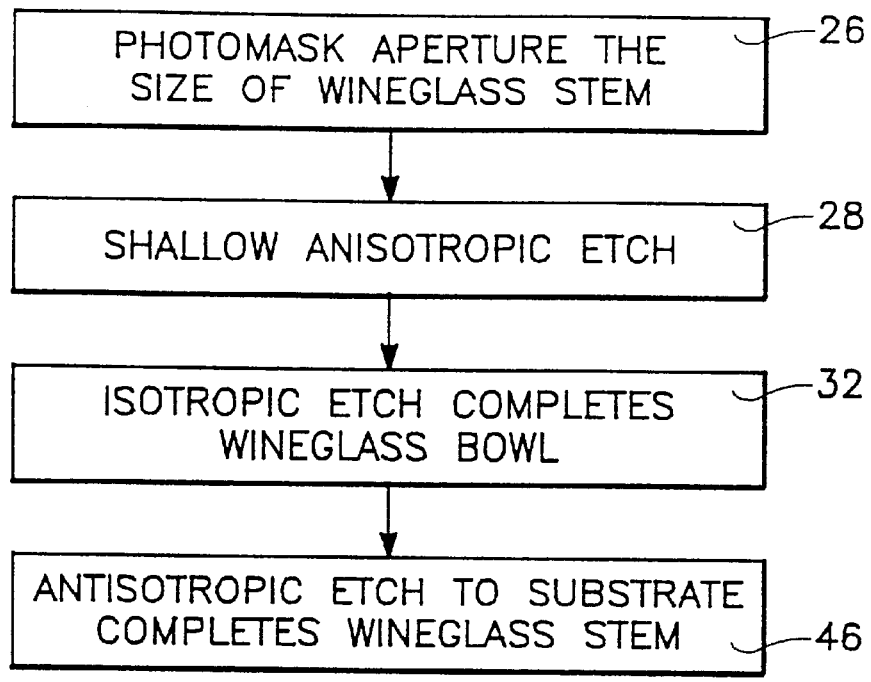
FIG. 3 is a process flow diagram for practicing one embodiment of the invention.
Figure 4:
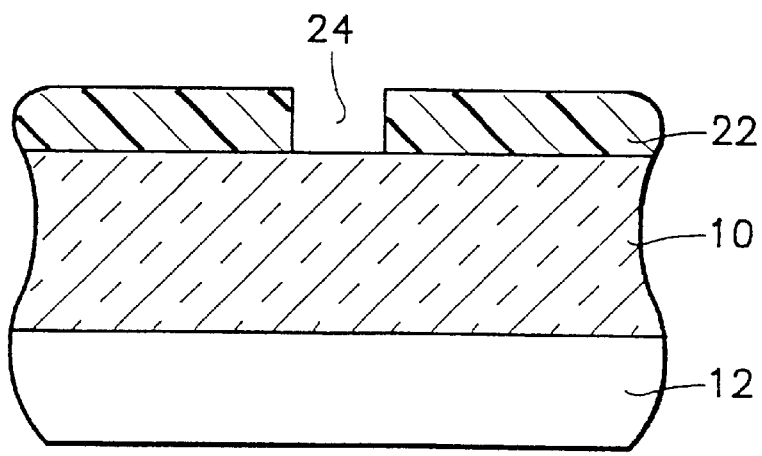
FIGS. 4, 5, 6, and 7 are cross-sectional view illustrating the steps in processing the wineglass hole of the invention.

In a photomasking step 26 of FIG. 3, the photoresist layer 22 illustrated in the cross-sectional view of FIG. 4 is deposited on the oxide layer 10 and is photographically patterned to have an aperture 24 extending to the underlying oxide 10 in the area of the intended contact hole. The size of the aperture 24 is generally of the same cross section as the wineglass stem that will extend to the substrate 12.

Figure 5:
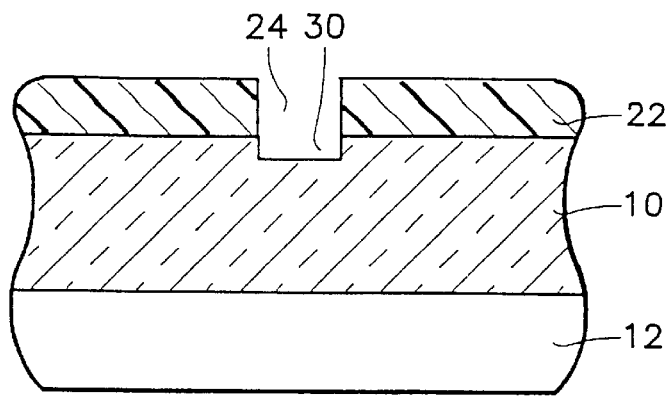

A first, anisotropic etch step 28 of FIG. 3 is used to form a shallow hole 30 in the oxide layer 10, illustrated in FIG. 5, not extending downwardly as far as the intended bottom of the bowl. This is not an aggressive etch, and a capacitively coupled, magnetically enhanced etch reactor, such as the MXP+ available from Applied Materials, Inc. of Santa Clara, Calif. can be used for this etch. In the MXP+ reactor, the wafer rests on a cathode pedestal connected to an RF power supply, and the counter-electrode is grounded. Additionally, electromagnetic coils induce a nearly static horizontal magnetic field in the volume between the electrode. This type of reactor is referred to as a magnetically enhanced reactive ion etcher (MERIE) and can be effectively used for anisotropic etching.

In one example of the invention, the process parameters presented in TABLE 1 were used in an MXP+ reactor with the aperture 24 of the mask having a width of about 0.9 µm and with the thickness of the oxide layer 10 being about 0.4 µm, but in different applications the thickness may range up to 1.2 µm.

TABLE 1

| | |
|---|---|
| Pressure | 200 mTorr |
| Cathode Power | 700 W |
| Magnetic Field | 30 gauss |
| Cathode | 15° C. |

TABLE 1-continued

| | |
|---|---|
| Temperature | |
| Wall | 15° C. |
| Temperature | |
| Helium Cooling | 14 Torr |
| Ar Flow | 150 sccm |
| $CF_4$ Flow | 15 sccm |
| $CHF_3$ Flow | 45 sccm |
| Etch Time | 12 sec |

Figure 6:
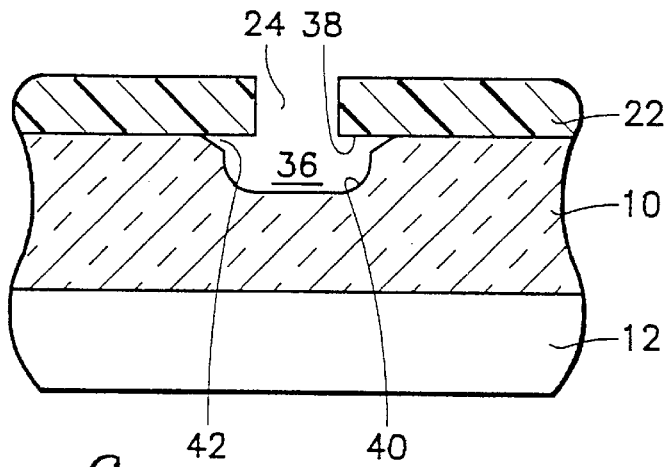

A second, isotropic etch step 32 of FIG. 3 then enlarges the shallow hole 30 into a wider and deeper hole 36 shown in FIG. 6. The isotropic etch forms undercuts 38 beneath the photomask 22 and also forms curved bottom corners 40 in the oxide layer 10. Bird's beaks 42 are likely to form at the interface between the oxide 10 and the photomask 22. The enlarged hole 36 forms the bowl of the wineglass shape.

In the example of the invention, the process parameters used in an RPS etch chamber, to be described later, are listed in TABLE 2.

TABLE 2

| | |
|---|---|
| Pressure | 2 Torr |
| Power | 1400 W |
| Cathode | 100° C. |
| Temperature | |
| Wall | 65° C. |
| Temperature | |
| Helium Cooling | 8 Torr |
| $CF_4$ Flow | 824 sccm |
| $NF_3$ Flow | 412 sccm |
| $O_2$ Flow | 264 sccm |
| Etch Time | 40 sec |

The isotropic etch completes the formation of the bowl of the wineglass. The extent of the isotropic etch, particularly as determined by the isotropic etching period, determines the lateral dimension of the wineglass etch. The isotropic etch also deepens the bowl by an amount determined by the period of the isotropic etch. That isotropically etched depth needs to be added to the anisotropically etched depth of the first step in determining the total depth. Nonetheless, the extents of the isotropic and anisotropic etches can be varied in combination for a desired lateral-to-vertical ratio.

Figure 7:
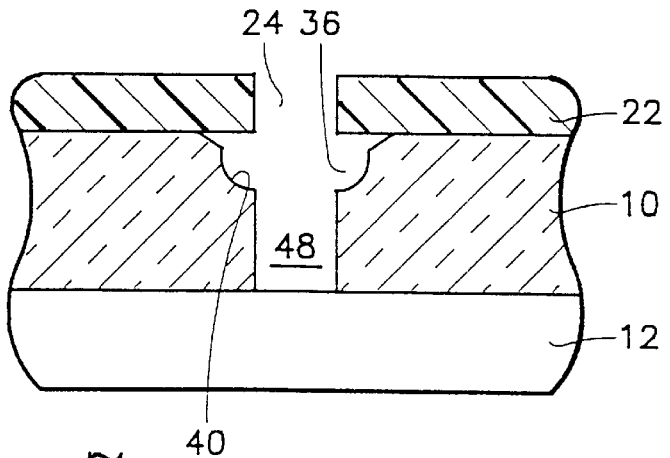

A third, anisotropic etch 46 of FIG. 3 etches through the oxide layer 10, as illustrated in FIG. 7, in an area mostly defined by the aperture 24 in the photomask 22. The etch forms an aperture 48 extending down to the underlying substrate 12, and the etched volume corresponds to the stem of the wineglass shape. The third etch may be the most demanding one since it may require the etching of a hole with a high aspect ratio, and further it is desirous that the etch be selective to the underlying material. However, the large lateral extent of the bowl area 36 lessens the severity of the geometry of deep hole etching. Such etches are well known. For example, the third etch 46 can have the same conditions as the first etch 28, as listed in TABLE 1. The same conditions apply to both etching a contact hole over silicon or etching a via hole over a metal. Using the same reactor for the first and third etch steps and an RPS reactor for the second etch step improves throughput since the two reactors are easily included on the same platform.

A series of experiments were performed varying, the times of the anisotropic and isotropic etch times for forming the bowl. The resultant bowl shape was then measured using scanning electron micrographs. The total etch depth is the total from the first two etching, steps, that is, the depth of the bowl. The shape is characterized by a mean L/V ratio for many etched holes, where L is the maximum lateral extent of the undercut on one side of the bowl (averaged over several holes) and V is the vertical extent. The results are presented in TABLE 3

TABLE 3

| MXP+ Etch Time (s) | RPS Etch Time (s) | Anisotropic Etch Depth (nm) | Total Etch Depth (nm) | L/V |
|---|---|---|---|---|
| 14 | 81 | 100 | 514.3 | 1.68 |
| 26 | 63 | 190 | 507.4 | 0.81 |
| 34 | 51 | 250 | 491.2 | 0.50 |
| 20 | 72 | 146.7 | 518.1 | 1.28 |
| 23 | 67 | 168.6 | 509.3 | 1.12 |
| 23 | 67 | 168.6 | 521.1 | 1.20 |

These results show that varying the relative times of the anisotropic and isotropic etches allows substantial control of the wineglass shape. If the etch depth data is calculated as a ratio of the anisotropic etch depth to the total etch depth, it is found that this ratio varies nearly linearly with the observed L/V ratio.

The isotropic etch can be accomplished by a variety of methods, even if the etching is restricted to the preferred plasma dry etching. The MXP+ chamber can be used for a nearly isotropic etching by using a non-polymer-former chemistry, such as the $CF_4+NF_3+O_2$ chemistry of TABLE 2. A similar chemistry uses $SF_6$ in place of the $NF_3$. In these two chemistries, any carbon left from the etching is oxidized by the $O_2$ to form $CO_2$, which is then vented from the system. Chamber pressures can range from 300 mTorr to 3 Torr. For a more isotropic etch, typically no bias is applied to the pedestal, and no magnetic field is applied to the plasma. It is noted that the MXP+ would produce a tapered etch rather than a curved isotropic etch. Similarly, recently developed inductively coupled high-density plasma (HDP) reactors can be used for the plasma etch by emphasizing the source plasma. An advantage of using the MXP+ or HDP reactors, is that the same reactor can be used for two or all three of the etching steps.

Figure 8:
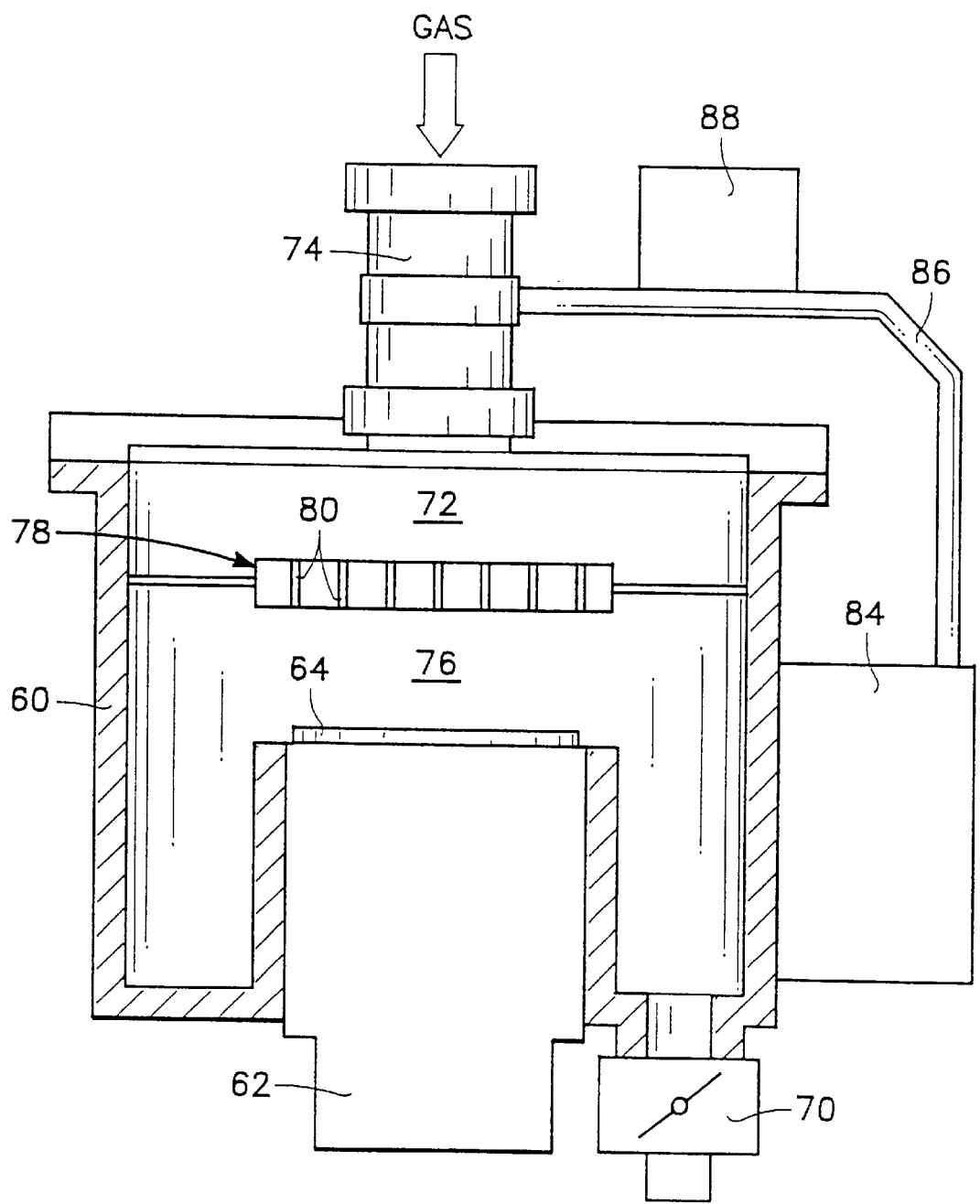
FIG. 8 is a cross-sectional view of a remote plasma-source (RPS) etch reactor usable with the invention.

However, we have found that an effective isotropic etcher is a remote plasma-source (RPS) etcher, which is used prior to the anisotropic etch in the MXP+ reactor. An RPS etch chamber is illustrated in the schematic cross section of FIG. 8. A vacuum chamber 60 contains a pedestal 62 having an electrostatic chuck on its upper surface for selectively clamping a wafer 64. An unillustrated vacuum pumping system pumps the chamber 60 through a throttle valve 70. Processing gas is admitted to an upper cavity 72 in the chamber 60 through a microwave applicator 74. The processing gas in the upper cavity is uniformly distributed to the processing area over the wafer 64 through a gas distribution plate 78 having a plurality of narrow holes 80 through it for passing the processing gas.

A magnetron 84 supplies microwave power in the gigahertz range through a microwave waveguide 86 to the applicator 74. An autotuner 88 on the waveguide 86 adjusts the microwave impedance for varying plasma conditions. The microwave power applied to the applicator 74 excites into a plasma the processing gas flowing through the applicator 74, and the excited gas flows through the gas distribution plate 78 to the processing area. Because of the distances involved, the plasma is mostly in the form of neutral radicals. In this chamber, there is no additional plasma generating equipment in the vacuum chamber 60, and no bias is applied to the pedestal 62. As a result, the excited gas plasma etching the wafer 64 does so without any directional acceleration across a plasma sheath, and the resulting etch is both soft and isotropic.

An RPS etcher is relatively inexpensive and is easy to operate and maintain so that a three-step, two-chamber etch is not that much more expensive than a single-chamber etch. A two-step, single-chamber etch for the latter two steps according to the invention can be performed in an MXP+ chamber by first setting the chamber process conditions to conditions favoring an isotropic etch by increasing the pressure, reducing the bias, and lowering the power. Then the chamber process conditions are set to conditions favoring anisotropic etching, such as using a chemistry similar to that of TABLE 1. It is also possible to add a remote plasma source to a capacitively or inductively coupled plasma reactor, e.g., the MXP+. The combination chamber can then be operated in either the isotropic RPS mode or the anisotropic local plasma mode or a combination of the two.

It is also possible to perform the etching of a tailored bowl shape by a single etch step that is intermediate an isotropic and a strongly anisotropic etch. For example, the pedestal bias and argon flow of can be reduced from those values listed in TABLE 1, but still have finite values. The flow polymer former $CHF_3$ can be increased. This approach is particularly applicable to L/V values of less than unity. For many etch and via etches, the etch conditions are optimized to produce side wall angles of greater than 85°, and preferably close to 90°, the ultimate in anisotropy. It is known that other conditions produce an etch of less anisotropy, for example, producing side walls angles of significantly less than 90°, say 60°. While such an etch is not isotropic, it combines the characteristic of a strongly anisotropic etch and an isotropic etch. A strongly anisotropic etching profile may be defined as one producing a side wall angle of greater than 80°.

Furthermore, more than two processing conditions producing differing anisotropy may be used in forming the bowl, for example, three or more steps producing decreasing anisotropy in etching the oxide, so as to tailor the curve of the bowl as well as the overall L/V ratio.

Although the invention has been applied to an oxide layer, the invention can also be applied to other dielectric layers, such as carbon-based dielectrics which may be used for their low dielectric constants.

It is thus seen that the invention provides additional control over the shape of a hole etched into an oxide layer, particularly in a wineglass etch for a contact or via. Nonetheless, the additional control is achieved with either the use of an additional low-cost chamber or by using the same plasma etch reactor under a number of different conditions.

What is claimed is:

1. A method of etching a hole in an inter-level dielectric layer overlying a substrate to be electrically contacted through said hole and having a mask formed thereover with a mask aperture through said mask, comprising the steps of:

a first step of plasma etching said inter-level dielectric layer through said mask aperture in an anisotropic etching process;

a second step, after said first step, of plasma etching said inter-level dielectric layer through said mask aperture in an at least partially isotropic etching process producing less anisotropy than said first step; and a third step, after said second step, of plasma etching through said inter-level dielectric layer through said mask aperture in an anisotropic etching process;

wherein said first and third steps include RF biasing a pedestal holding said substrate more strongly than in said second step.

2. The method of claim 1, wherein said inter-level dielectric layer overlies a substrate to be electrically contacted through said hole, and said third step etches through said inter-level dielectric layer.

3. The method of claim 1, wherein said second step includes exciting a processing gas into a plasma with a remote plasma source.

4. The method of claim 3, wherein said inter-level dielectric layer is an oxide layer.

5. The method of claim 4,
wherein said first step includes exciting a first processing gas into a first plasma to etch said inter-level dielectric layer and said first processing gas comprises a fluorocarbon gas and argon, and
wherein said second step includes exciting a second processing gas into a second plasma to etch said inter-level dielectric layer and said second processing gas comprises a fluorocarbon gas and $O_2$ gas.

6. The method of claim 5, wherein said second processing gas additionally comprises $NF_3$.

7. The method of claim 3, wherein said remote plasma source includes an applicator and a source of microwave power and wherein said step of exciting said processing gas into a plasma includes:
flowing said processing gas into an applicator;
applying said microwave power to said applicator to excite said processing gas into said plasma; and
flowing said processing gas excited into said plasma from said applicator to an etching chamber holding said substrate containing said inter-level dielectric layer.

8. The method of claim 3, wherein said remote plasma source includes a source of microwave power in the gigahertz range.

9. The method of claim 1, wherein said first and second steps are performed in a same plasma reaction chamber.

10. The method of claim 1, wherein said first, second and third steps are performed in a same plasma reaction chamber.

11. A method of etching a hole in an inter-level dielectric layer consisting of an oxide layer and having a mask formed thereover with a mask aperture through said mask, comprising the steps of:
a first step of plasma etching said inter-level dielectric layer through said mask aperture in an anisotropic etching process, wherein said first step includes a flow of a first processing gas comprising a fluorocarbon gas;
a second step, after said first step, of plasma etching said inter-level dielectric layer through said mask aperture in an at least partially isotropic etching process producing less anisotropy than said first step, wherein said second step includes a flow of a second processing gas comprising $O_2$ gas and a third step, after said second step, of plasma etching said inter-level dielectric layer through said mask aperture in an anisotropic etching process.

12. The method of claim 11, wherein said inter-level dielectric layer consists of an oxide layer.

13. The method of claim 11, wherein said first processing gas additionally comprises argon and said second processing gas additionally comprises a fluorine-containing non-carbon gas.

14. The method of claim 13, wherein said fluorine-containing non-carbon gas is selected from the group consisting of $NF_3$ and $SF_6$.

15. The method of claim 14, wherein said first processing gas comprises $CF_4$, $CHF_3$, and said argon.

16. A method of etching a hole through a dielectric layer in a substrate, comprising the steps of:
a first etching step including RF biasing a pedestal supporting said substrate within a plasma reaction chamber, flowing a first etching gas into said chamber, and exciting said first etching gas into a plasma within said chamber, wherein said plasma of said first etching step using said first etching gas produces an etching profile of said hole that is intermediate an isotropic etch and a strongly anisotropic etch to produce a first hole portion having a top wider than a bottom thereof; and
a second etching step performed subsequent to said first etching step including a strongly anisotropic etch of said hole through said oxide layer.

17. The method of claim 16, wherein said etching profile of the first step has sidewall angles of less than 80°.

18. The method of claim 17, wherein said strongly anisotropic etch produces sidewall angles of greater than 85°.

19. The method of claim 16, wherein said dielectric layer is an oxide layer.

20. The method of claim 19, wherein said first etching gas comprises a fluorocarbon gas and argon.

21. The method of claim 16, wherein said dielectric layer is an inter-level dielectric layer.

22. The method of claim 16, wherein said first etching gas consists of an unvarying set of component gases.

23. A method of etching a hole in an oxide layer formed in a substrate and overlaid with a patterned mask, comprising the steps of:
a first etching step comprising flowing into a plasma reaction chamber containing said substrate a first gas mixture comprising a fluorocarbon and argon and exciting said first gas mixture into a plasma to etch said oxide layer; and
a subsequent second etching step comprising flowing into a plasma reaction chamber and exciting into a plasma a second gas mixture comprising a fluorocarbon gas, $O_2$ gas, and a fluorine-containing gas selected from the group consisting of nitrogen trifluoride and sulfur hexafluoride to thereby etch said oxide layer;
wherein said first etching step etches said hole more anisotropically than does said second etching step.

* * * * *